(12) United States Patent
Christensen (10) Patent No.: US 9,475,077 B2
(45) Date of Patent: Oct. 25, 2016

(54) HIGH SPEED COATING AND DISPENSING APPARATUS

(71) Applicant: SPECIALTY COATING SYSTEMS, INC., Indianapolis, IN (US)

(72) Inventor: Dennis Ronn Christensen, Indianapolis, IN (US)

(73) Assignee: SPECIALTY COATING SYSTEMS, INC., Indianapolis, IN (US)

( * ) Notice: Subject to any disclaimer, the term of this patent is extended or adjusted under 35 U.S.C. 154(b) by 329 days.

(21) Appl. No.: 14/227,337

(22) Filed: Mar. 27, 2014

(65) Prior Publication Data

US 2016/0158786 A1    Jun. 9, 2016

Related U.S. Application Data

(60) Provisional application No. 61/806,136, filed on Mar. 28, 2013.

(51) Int. Cl.

| | | |
|---|---|---|
| *B05B 3/00* | (2006.01) | |
| *B05B 13/02* | (2006.01) | |
| *B05C 11/00* | (2006.01) | |
| *B05B 13/04* | (2006.01) | |
| *B05C 5/02* | (2006.01) | |
| *B25J 9/02* | (2006.01) | |
| *B25J 17/02* | (2006.01) | |

(52) U.S. Cl.
CPC ............. *B05B 13/0431* (2013.01); *B05B 3/00* (2013.01); *B05C 5/0216* (2013.01); *B25J 9/026* (2013.01); *B25J 17/0275* (2013.01); *H05K 2203/1366* (2013.01)

(58) Field of Classification Search
USPC .................. 118/323, 321, 305, 300, 679–682
See application file for complete search history.

(56) References Cited

U.S. PATENT DOCUMENTS

| | | | |
|---|---|---|---|
| 3,052,212 A * | 9/1962 | MacArthur | ......... B05B 13/0415 118/301 |
| 4,976,582 A | 12/1990 | Clavel | |
| 5,669,971 A | 9/1997 | Bok et al. | |
| 6,132,809 A | 10/2000 | Hynes et al. | |
| 6,425,745 B1 * | 7/2002 | Lavin | ......................... C23C 4/12 118/321 |
| 6,447,847 B1 | 9/2002 | Hynes et al. | |
| 6,766,711 B2 | 7/2004 | Hvittfeldt et al. | |
| 6,896,473 B2 | 5/2005 | Schuler | |
| 7,735,390 B2 | 6/2010 | Nabat et al. | |
| 2009/0317554 A1 * | 12/2009 | Christensen | ........ B05B 13/0431 427/427.2 |

* cited by examiner

*Primary Examiner* — Yewebdar Tadesse
(74) *Attorney, Agent, or Firm* — Lando & Anastasi, LLP (57) ABSTRACT

An apparatus includes a housing, a gantry system supported by the housing, a movement mechanism coupled to the gantry system, and a dispensing unit coupled to the movement mechanism and configured to deposit material. The dispensing unit assumes an increasing angle of tilt by manipulating the movement mechanism. Embodiments of the movement mechanism are further disclosed.

8 Claims, 7 Drawing Sheets

HIGH SPEED COATING AND DISPENSING APPARATUS

CROSS REFERENCE TO RELATED APPLICATIONS

This application claims priority under 35 U.S.C. §119(e) to U.S. Provisional Application Ser. No. 61/806,136 entitled "HIGH SPEED COATING AND DISPENSING APPARATUS," filed on Mar. 28, 2013, which is incorporated herein by reference in its entirety.

BACKGROUND OF THE DISCLOSURE

1. Field of the Disclosure

The present disclosure relates generally to apparatus and methods for dispensing materials on objects or substrates, and more particularly to an apparatus and related methods for spray coating and dispensing such materials on objects and substrates.

2. Discussion of Related Art

Coating apparatus and dispensers are used in a variety of industries to spray and dispense various substances. Such apparatus may be configured to dispense a variety of materials onto objects and substrates. Typical coating and dispensing systems use Cartesian-type movement systems configured to achieve movement along three to five axes of movement, and are fitted with a variety of dispensing units or heads to transfer the material to the substrate in a controlled fashion. Reference can also be made to the apparatus disclosed in U.S. Patent Application Publication Nos. 2009/0317554A1 and 2012/0171383A1, both of which are assigned to the assignee of the present disclosure and are incorporated herein by reference.

SUMMARY OF THE DISCLOSURE

One aspect of the present disclosure is directed to a coating and dispensing apparatus for depositing material. In one embodiment, the apparatus comprises a dispensing unit configured to deposit material and a movement mechanism coupled to the dispensing unit. The dispensing unit assumes an increasing angle of tilt as a post is moved away from a motor shaft and a direction of the dispensing head is controlled by rotating a motor to change a location of the post in an arc around the motor shaft.

Embodiments of the apparatus further include a controller to control a specific tilting angle and the direction of the dispensing head to allow more variation in motion programming and control. The specific tilting angle of the dispensing unit from the z-axis may be controlled automatically using a second motor. The second motor adjusts a location of the post relative to the motor shaft. The specific the tilting angle of the dispensing unit from the z-axis may be controlled by using a pair of motors with co-axial shafts and a cam mechanism so that a change in angle between the shafts controls the angle of the dispensing unit.

In certain embodiments, the movement mechanism may include a C-shaped bracket, a gimbal assembly provided at a lower end of the C-shaped bracket and configured to support the dispensing unit, and a motor assembly secured to the C-shaped bracket at an upper end of the C-shaped bracket. The motor assembly may include a motor, a motor shaft configured to drive the rotation of a disk, a downwardly extending post that is adjustable with respect to a centerline of the disk, and a swivel arm connected to the gimbal assembly and the post. The gimbal assembly may include a U-shaped bracket rotatably attached to the C-shaped bracket along a horizontal axis and a mounting bracket pivotally attached to the U-shaped bracket along an axis that is perpendicular to the horizontal axis. The mounting bracket may be secured to the swivel arm at an upper end of the mounting bracket and configured to support the dispensing unit.

Another aspect of the disclosure is directed to a coating and dispensing apparatus as shown and described herein.

A further aspect of the disclosure is directed to an apparatus comprising a housing, a gantry system supported by the housing, a movement mechanism coupled to the gantry system, and a dispensing unit coupled to the movement mechanism and configured to deposit material. The dispensing unit assumes an increasing angle of tilt by manipulating the movement mechanism.

Embodiments of the apparatus further may include a controller to control the specific tilting angle and the direction of the dispensing head to allow more variation in motion programming and control. In one embodiment, the movement mechanism may include a rotary drive assembly coupled to the dispensing unit at an upper end of the dispensing unit. The movement mechanism further may include a gimbal assembly coupled to the dispensing unit at a lower end of the dispensing unit. The movement mechanism further may include a C-shaped bracket secured to the gantry system, with the gimbal assembly being provided at a lower end of the C-shaped bracket and configured to support the dispensing unit. The movement mechanism further may include a motor assembly secured to the C-shaped bracket at an upper end of the C-shaped bracket. The movement mechanism further may include a motor shaft coupled to the motor, with the motor shaft being configured to drive the rotation of a disk coupled to the upper end of the dispensing unit. The movement mechanism further may include a downwardly extending post that is adjustable with respect to a centerline of the disk, and a swivel arm connected to the gimbal assembly and the post. As the post may be moved away from the motor shaft, a direction of the dispensing head may be controlled by rotating the motor to change a location of the post in an arc around the motor shaft. The gimbal assembly may include a U-shaped bracket rotatably attached to the C-shaped bracket along a horizontal axis. The gimbal assembly further may include a mounting bracket pivotally attached to the U-shaped bracket along an axis that is perpendicular to the horizontal axis. The mounting bracket may be secured to the swivel arm at an upper end of the mounting bracket and configured to support the dispensing unit.

Another aspect of the disclosure is directed a movement mechanism for providing a desired angle of tilt of a dispensing unit of a coating and dispensing apparatus. In one embodiment, the movement mechanism comprises a rotary drive assembly coupled to the dispensing unit at an upper end of the dispensing unit, and a gimbal assembly coupled to the dispensing unit at a lower end of the dispensing unit.

Embodiments of the movement mechanism further may include a C-shaped bracket secured to a gantry of the apparatus, with the gimbal assembly being provided at a lower end of the C-shaped bracket and configured to support the dispensing unit. The movement mechanism further may include a motor assembly secured to the C-shaped bracket at an upper end of the C-shaped bracket. The movement mechanism further may include a motor shaft coupled to the motor, the motor shaft being configured to drive the rotation of a disk coupled to the upper end of the dispensing unit. The movement mechanism further may include a downwardly extending post that is adjustable with respect to a centerline of the disk, and a swivel arm connected to the gimbal assembly and the post. As the post is moved away from the motor shaft, a direction of the dispensing head may be controlled by rotating the motor to change a location of the post in an arc around the motor shaft. The gimbal assembly may include a U-shaped bracket rotatably attached to the C-shaped bracket along a horizontal axis. The gimbal assembly further may include a mounting bracket pivotally attached to the U-shaped bracket along an axis that is perpendicular to the horizontal axis. The mounting bracket may be secured to the swivel arm at an upper end of the mounting bracket and configured to support the dispensing unit.

The present disclosure will be more fully understood after a review of the following figures, detailed description and claims.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. Reference is made to the following drawing figures, which are incorporated herein by reference and in which.

DETAILED DESCRIPTION OF THE PREFERRED EMBODIMENTS

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The apparatus of embodiments disclosed herein is capable of other embodiments and of being practiced or being carried out in various ways. Also the phraseology and terminology used herein is for the purpose of description and should not be regarded as limiting. The use of "including," "comprising," "having," "containing" "involving," and variations thereof herein, is meant to encompass the items listed thereafter and equivalents thereof as well as additional items.

For purposes of illustration, embodiments of the present disclosure will now be described with reference to a high speed coating and dispensing apparatus used to spray coat or otherwise dispense material on an object or substrate. With certain applications, coating materials may be applied to printed circuit boards to protect against damage caused by the environment in which the circuit board operates, such as moisture, dust, chemicals and temperature. The coating can be achieved with a high speed coating and dispensing apparatus that includes a dispensing unit applicator capable of applying material on the substrate in selective areas. In certain examples, flow rates and material viscosity are programmed into a computer system of the apparatus to control the applicator so that a desired coating thickness is maintained.

In certain embodiments, the material includes temperature vulcanizing (RTV) silicone rubber, glues, sealants and other liquid coatings. However, other materials, including polymeric materials, may be employed with the apparatus disclosed herein. In other examples, solvent-based, water-based and solid materials may be employed. In other embodiments, objects may include, but are not limited to, electronic substrates, such as semiconductor wafers and printed circuit boards, medical devices, such as stents, and any other object or component requiring thin coatings of material. For example, and without limitation, objects used in the electronics, military, medical and automotive industries may be coated using the apparatus and methods disclosed herein. One skilled in the art will appreciate that embodiments of the present disclosure are not limited to coating and dispensing apparatus capable of spraying or dispensing protective materials onto electronic substrates, but rather, may be used in any application intended to coat objects, dispense glue, create a gasket or other automated placement of fluids.

In addition, although a particular coating and dispensing apparatus platform is disclosed herein, the dispensing unit of embodiments disclosed herein may be used with other types of platforms designed to manipulate such dispensing units. In one embodiment, the platform may include spray coating platforms sold by Specialty Coating Systems, Inc. of Indianapolis, Ind. under the trade name Precisioncoat.

Figure 1:
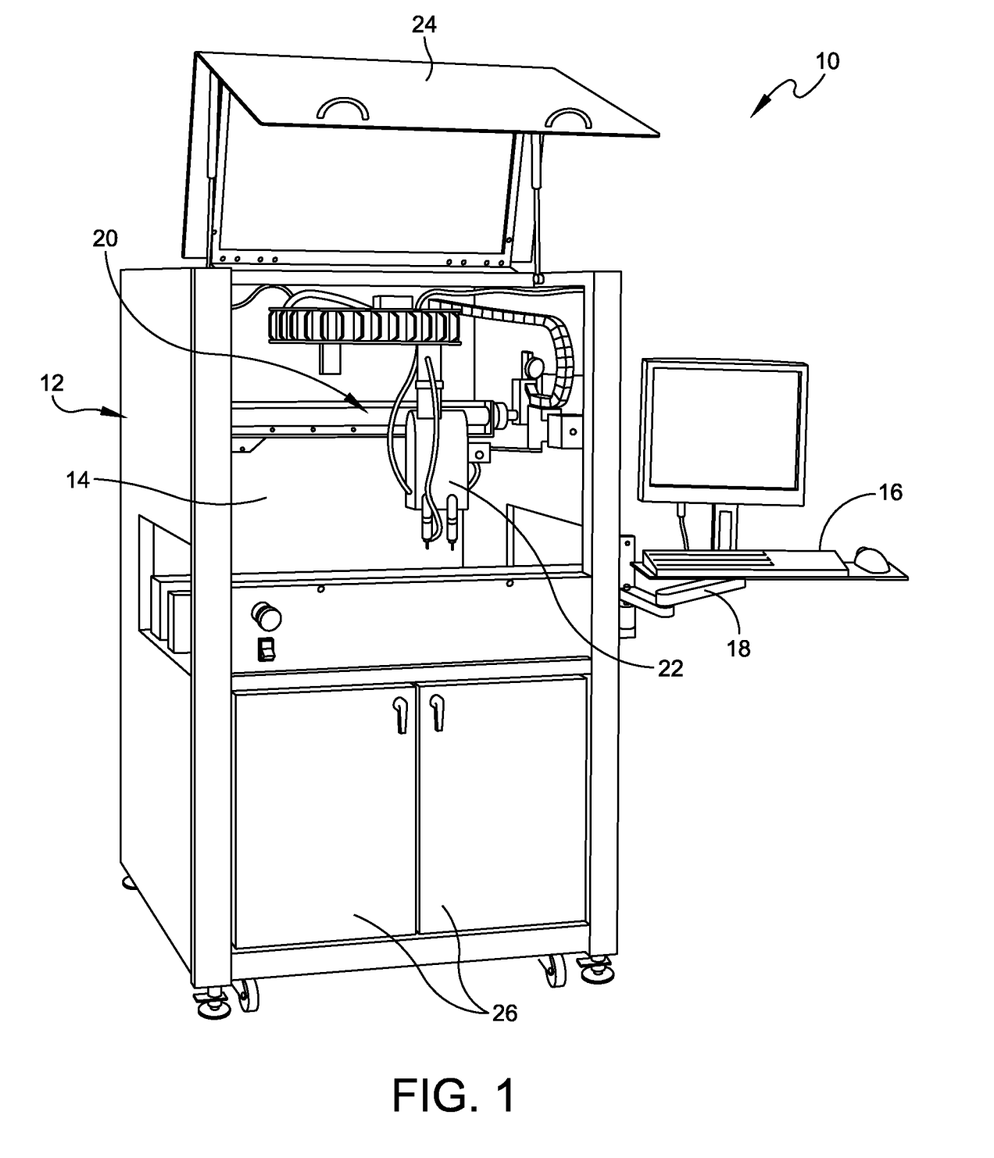
FIG. 1 is a front perspective view of an embodiment of a high-speed coating and dispensing apparatus of the present disclosure.
Figure 2:
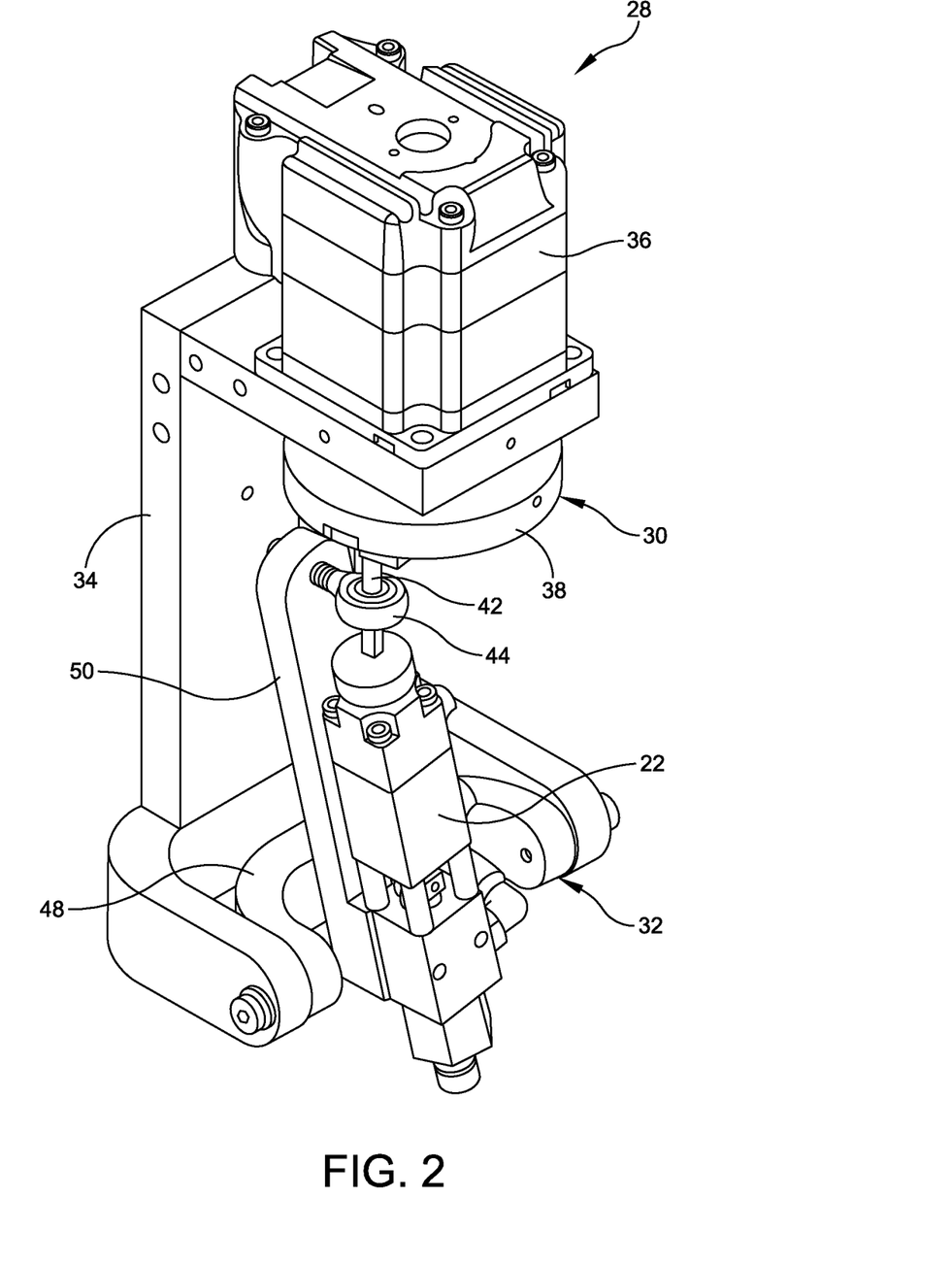
FIG. 2 is a perspective view of a moving mechanism and dispenser of an embodiment of the a high speed coating and dispensing apparatus.
Figure 3:
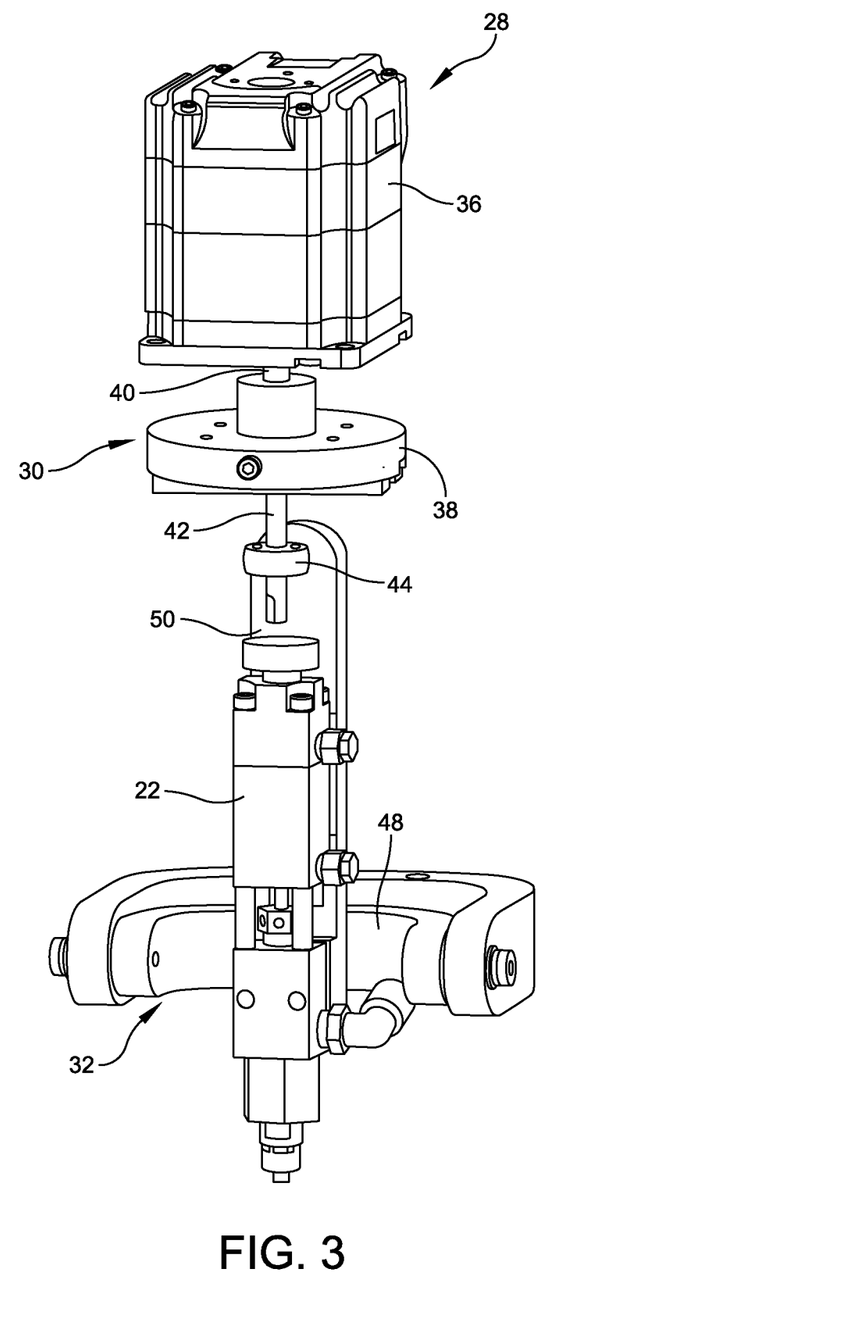
FIG. 3 is another perspective view of the moving mechanism and dispenser.
Figure 4:
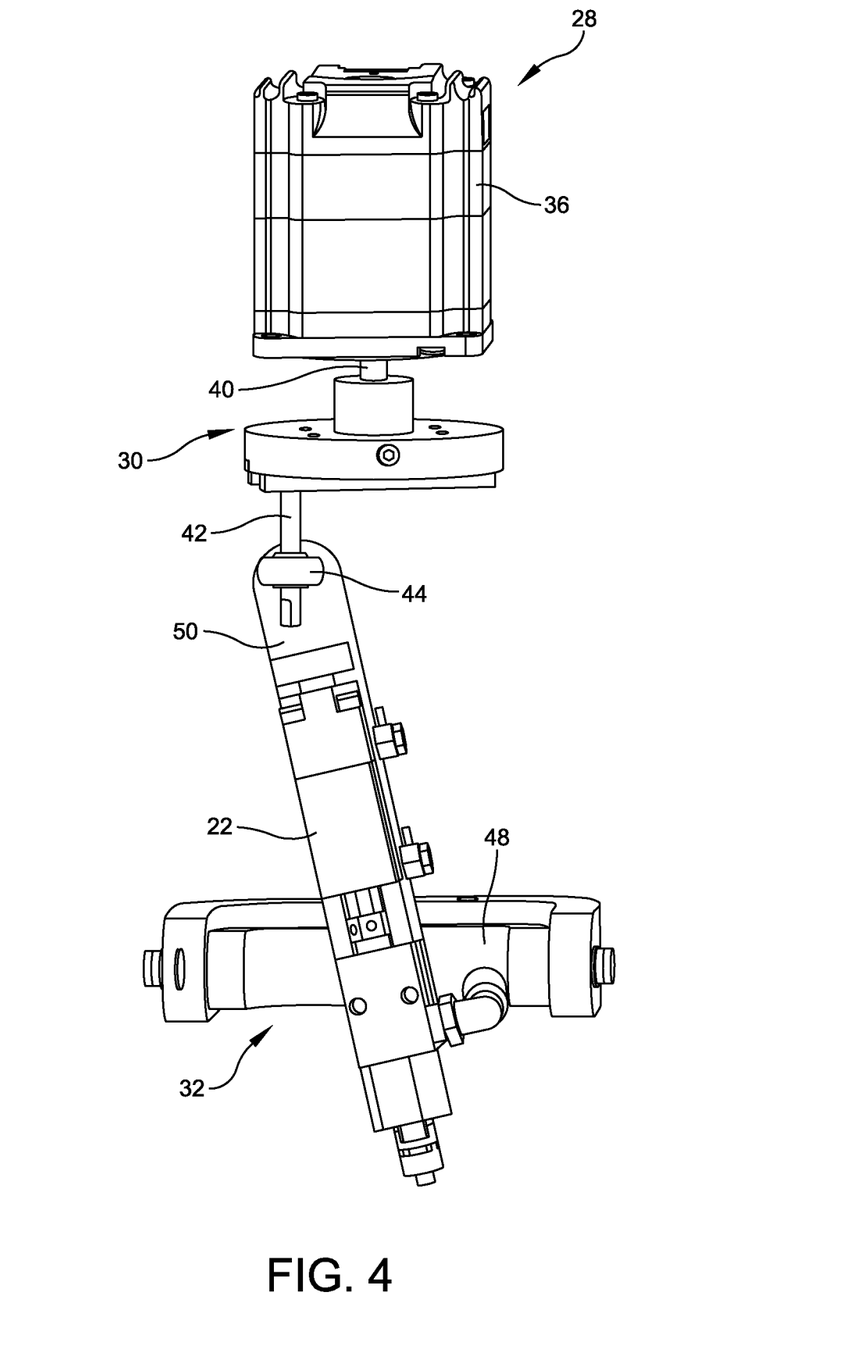
FIG. 4 is another perspective view of the moving mechanism and dispenser.
Figure 5:
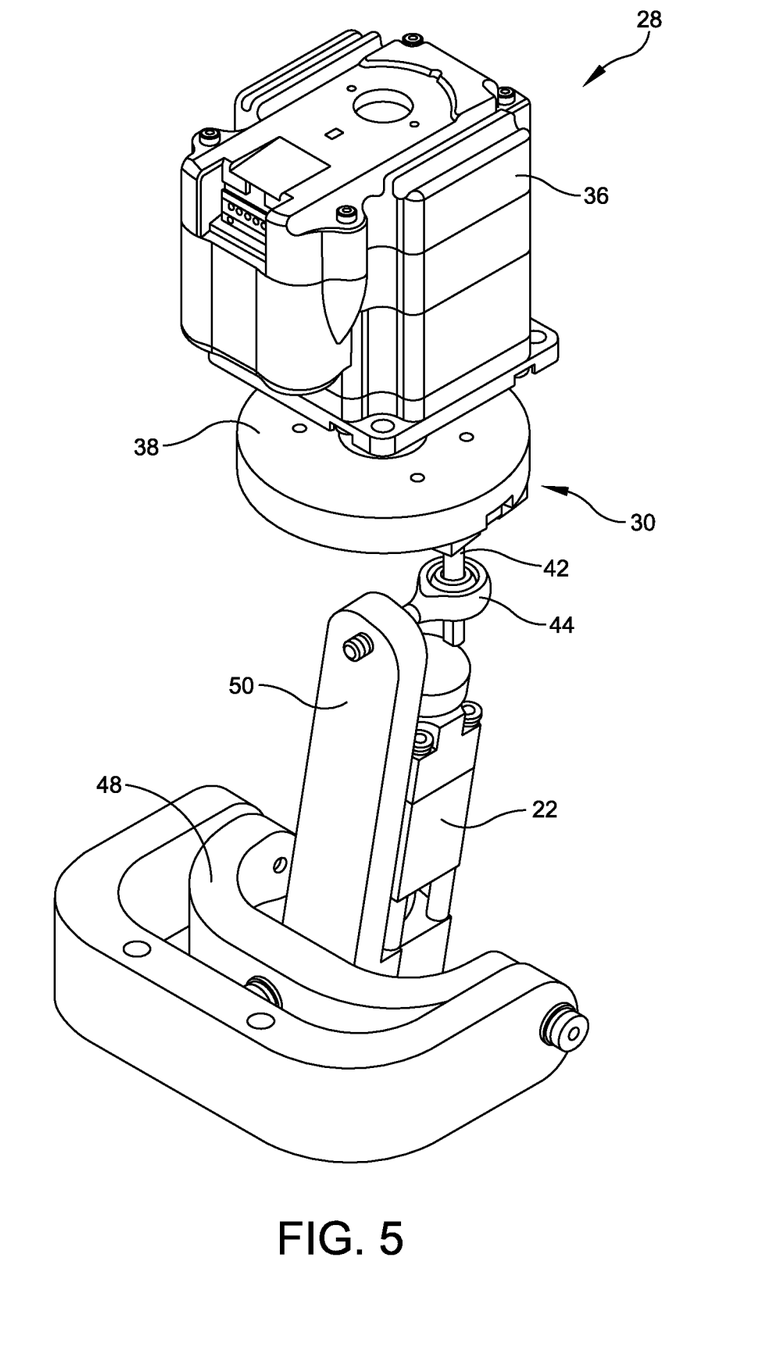
FIG. 5 is another perspective view of the moving mechanism and dispenser with a bracket removed to more clearly view the movement mechanism.
Figure 6:
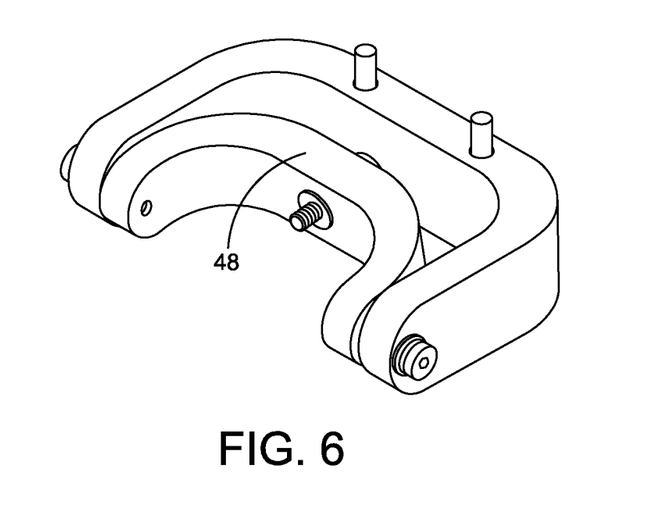
FIG. 6 is a perspective view of a portion of the movement mechanism.
Figure 7:
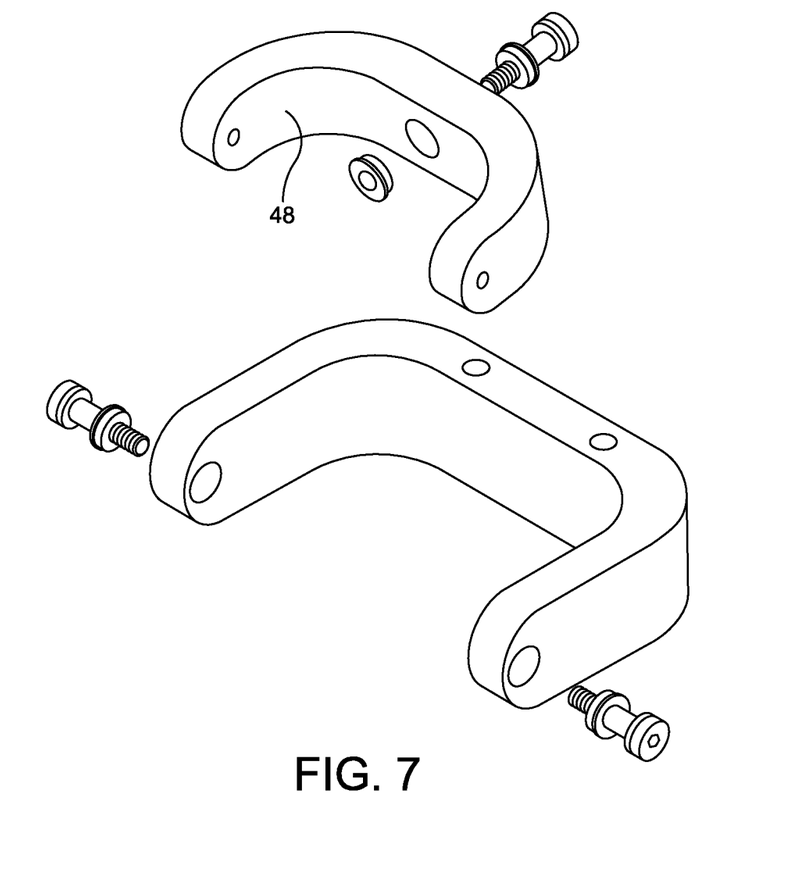
FIG. 7 is an exploded perspective view of the portion of the movement mechanism shown in FIG. 6.
Figure 8:
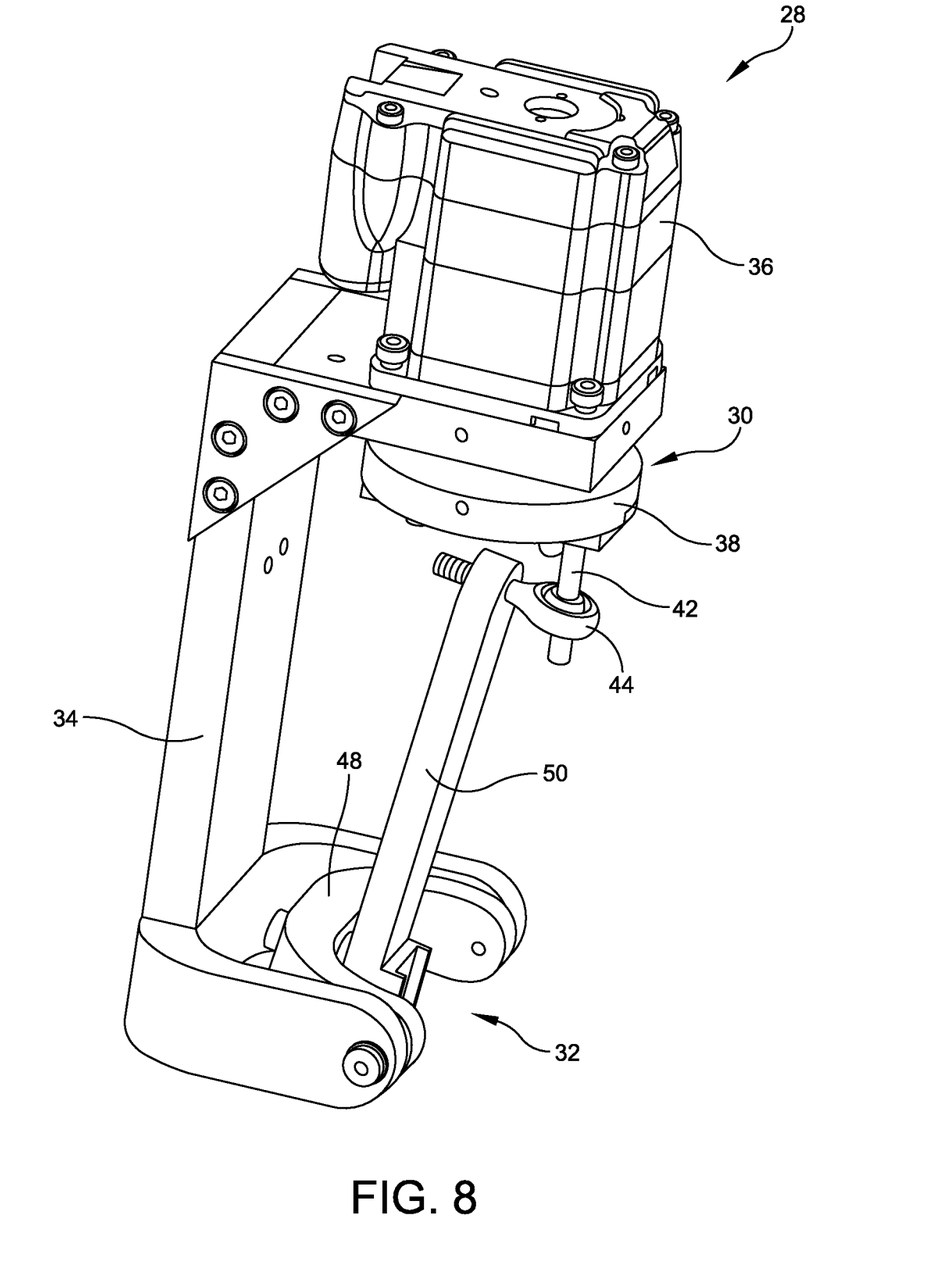
FIG. 8 is a perspective view of the assembled movement mechanism.

Referring now to the drawings, and more particularly to FIG. 1, there is generally indicated at 10 a high-speed coating and dispensing apparatus of an embodiment of the disclosure. As shown, the apparatus 10 includes a housing, generally indicated at 12, that supports components of the apparatus. The housing 12 is a box-shaped structure that defines an interior working space 14 used to perform conformal coating and dispensing operations. The components, in part, may include a control system 16 supported by an extendable arm and platform 18 secured to the housing 12, a gantry system, generally indicated at 20, mounted within the interior 14 of the housing, and a coating or dispensing unit or head 22 coupled to the gantry system. Although the coating or dispensing unit 22 shall be referred to herein as a "dispensing unit," it should be understood that the dispensing unit may embody a spray or coating unit. The control system 16 is configured to control the operation of the apparatus 10. In the shown embodiment, the dispensing unit 22 may be mounted on the gantry system 20, which enables the dispensing unit to be moved in the x-axis, y-axis, z-axis and rotational (when provided) directions within the interior 14 of the apparatus 10 under the control of the control system 16 when performing a coating or dispensing operation.

In one embodiment, the control system 16 may be configured to have a suitable operating system (e.g., Windows XP® offered by Microsoft Corporation of Redmond, Wash.), with application-specific software to control the operation of the apparatus 10. In a certain embodiment, an operator of the apparatus 10 may operate the apparatus either manually by manipulating a keyboard and a mouse provided with the control system 16 or automatically by preprogramming the control system by means of the keyboard and mouse through the control system.

Still referring to FIG. 1, the front of the apparatus 10 may be accessed through a see-through door 24 hingedly mounted on the housing 12. Two handles are provided to pivot the see-through door 24 about the hinges to access the interior 14 of the housing 12. The front of the housing 12 further includes two cabinet doors together indicated at 26 that are hingedly connected to the housing 12 at the bottom of the side of the housing so that the cabinet doors are opened in the traditional manner.

In some embodiments, the back of the housing 12 of the apparatus 10 includes a panel of suitable material, e.g., sheet metal material. The back of the housing 12 may include an opening through which fumes generated from operations may be vented from the interior 14 of the housing of the apparatus 10 from one of two material supply canisters, which are provided outside the conformal coating apparatus. In a certain embodiment, a larger canister is provided for supplying a greater amount of material. A smaller canister is also provided. Each canister is configured to supply material under pressure to the head of the apparatus 10.

As discussed above, traditional coating and dispensing machines have a gantry system that is configured to provide x-axis, y-axis and z-axis movement, and in some embodiments rotational movement. The coating and dispensing apparatus 10 of the present disclosure is adapted to be mounted on such the gantry system 20 to move the dispensing unit 22 in the x-axis, y-axis and z-axis directions. With prior apparatus, the traditional gantry system may also be configured to rotate about the z-axis and pivot about a point on the z-axis.

Referring to FIGS. 2-8, the coating and dispensing apparatus 10 of the present disclosure includes a uniquely constructed movement mechanism, generally indicated at 28, that is coupled to the dispensing unit 22 to provide pivotal movement of the dispensing unit. The dispensing unit 22 may be manipulated by the control system 16 coupled to the movement mechanism 28 and the dispensing unit. Specifically, the control system 16 may be configured to control the automated movement of the movement mechanism 28 to provide nearly unlimited freedom of movement of the dispensing unit 22.

In one embodiment, the movement mechanism 28 embodies two primary components—a rotary drive assembly generally indicated at 30 coupled to an upper end of the dispensing unit 22 and a gimbal assembly generally indicated at 32 that is coupled to a lower end of the dispensing unit. The arrangement is such that the dispensing unit 22 is able to pivot in any direction with respect to an object or a substrate when operating the high speed coating and dispensing apparatus 10.

As shown in the drawings, the movement mechanism 28 includes a C-shaped bracket 34 configured to be mounted on the gantry system 20 of the apparatus 10. The C-shaped bracket 34 supports the rotary drive assembly 30 and the gimbal assembly 32, which is configured to support the dispensing unit 22. The C-shaped bracket 34 also supports a motor 36, which is coupled to the rotary drive assembly 30. In one embodiment, the rotary drive assembly 30 includes a circular disk 38 rotationally coupled to the motor 36 by a motor shaft 40 to drive the rotation of the disk. The disk 38 includes a downwardly extending post or shaft 42 that is adjustable with respect to a centerline of the motor shaft 40 and the disk. The post 42 is secured within an opening formed in a swivel arm 44, which follows the movement of the post. In one embodiment, the motor 36 is used to provide the back and forth movement of the post 42, which changes the angle of the dispensing unit 22.

The gimbal assembly 32 is mounted on a lower end of the C-shaped bracket 34, and includes a U-shaped bracket 48 rotatably attached to a U-shaped portion of the C-shaped bracket along a horizontal axis and a mounting bracket 50 pivotally attached to the U-shaped bracket along an axis that is perpendicular to the horizontal axis. The mounting bracket 50 is secured to the swivel arm 44 at an upper end of the mounting bracket and configured to support the dispensing unit 22.

The arrangement is such that the dispensing unit 22 in a zero degree tilt position is vertical and parallel to a z-axis. The motor 36 mounted on the C-shaped bracket 34 above the dispensing unit 22 is positioned so that the motor shaft 40 of the motor is aligned with a centerline of the dispensing unit in the zero degree tilt position. The post 42 is slidably attached to the disk 38 within a slot provided on the bottom surface of the disk to adjust a position of the post with respect to the centerline of the motor shaft 40 and the dispensing unit 22. The dispensing unit 22 assumes an increasing angle of tilt as the post 42 is moved away from the centerline. Thus, the angle of tilt of the dispensing unit 22 is controlled by moving the post 42 away from and toward the centerline of the motor shaft 40 and the dispensing unit. The direction of the dispensing unit 22 tilt is controlled by the motor 36, which changes the location of the post 42 in an arc around the motor shaft 40. Thus, the direction in which the dispensing unit 22 is pointed is controlled by rotating the post 42 about the motor shaft 40 thus moving the circular disk 38 and moving the post with respect to the centerline.

The gimbal assembly 32 is applied to control an angle of the dispensing unit 22 by rotation from perpendicular, along a rotational point on the z-axis but not rotate the z-axis or move vertically. The motor control can be integrated with other motion axis controls to direct a nozzle of the dispensing unit 22 in complex motor combinations. In another embodiment, the specific tilting angle of the dispensing unit 22 from the z-axis may be controlled automatically using a second motor. The second motor can be integrated with other motion axes to direct the nozzle of the dispensing unit 22 in complex motion combinations, including varying the tilt angle. In a certain embodiment, the tilting angle of the dispensing unit 22 from the z-axis may be controlled by using a pair of motors with co-axial shafts and a cam mechanism so that a change in angle between the shafts controls the angle of the dispensing unit. The motorized rotation of the dispensing unit can be bi-directional.

It should be understood that the apparatus 10 disclosed herein employs a unique combination of a rotational motor to control a direction of the dispensing unit 22 through the gimbal assembly 32, having the benefit of increased speed and precision of dispensing applications.

The coating and dispensing apparatus 10 of the present disclosure can be configured to include air atomized spraying heads, dispensing heads, swirl-coating nozzles, dual-mode nozzles, and jetting heads. Coating applications using a needle to dispense the material may include needle valves and auger valves. Each of these valves can be mounted on the gantry system or multiple heads can be mounted at the same time. An additional axis of motion can be fitted to the movement system thereby enabling four, five or six axes of motion to further add flexibility to place the coating as necessary on substrates. In such an embodiment, the dispensing unit 22 may be configured to provide the one or more additional axes of motion.

The platform may embody a small tabletop selective coater that has three axes of motion capability and the ability to carry any of the coating technologies disclosed herein. By comparison, Cartesian gantry systems and similar gantries require more space and weigh more to accommodate the same work area.

During operation, when spraying material on a substrate, the dispensing unit 22 is positioned proximate to the substrate. The control system 16 controls the automated movement of the dispensing unit 22 to spray material on the substrate by moving the dispensing unit in x-axis, y-axis and z-axis directions by means of the gantry system 20 with finite movement being provided by the movement mechanism 28. The dispensing unit 22 may be configured to spray particular materials. For example, the dispensing unit 22 may be configured with a particular type of nozzle suitable for spraying a coating and dispensing material. In one embodiment, the dispensing unit 22 may be an assembly of separate components or provided by a suitable manufacturer, such as EFD, Inc. of East Providence, R.I. or Graco Inc. of North Canton, Ohio.

During operation, when spraying material on a substrate, such as an electronic substrate, the dispensing unit 22 is positioned proximate to the substrate by manipulating the gantry system 20. The control system 16 controls the automated movement of the dispensing unit 22 by manipulating the gantry system 20 to spray material on the substrate by moving the dispensing unit in x-axis, y-axis, z-axis directions by means of the movement mechanism. The control system 16, by means of controlling the operation of the actuators, controls movement (linear and rotational) of the movement mechanism 28 to provide finite movement of the dispensing unit 22.

Thus, it should be observed that the apparatus 10 disclosed herein are particularly suited for positioning a dispensing unit 22 in a desired position without having to manually manipulate the dispensing unit. The control system 16 may be programmed to move the gantry assembly 20 and the movement mechanism 28 to position the dispensing unit 22. The automated movement of the dispensing unit 22 saves time as well as enables the operation to exactly position the dispensing unit for optimal operation.

Having thus described at least one embodiment of the present disclosure, various alternations, modifications and improvements will readily occur to those skilled in the art. Such alterations, modifications and improvements are intended to be within the scope and spirit of the disclosure. Accordingly, the foregoing description is by way of example only and is not intended to be limiting. The disclosure's limit is defined only in the following claims and equivalents thereto.

What is claimed is:

1. A coating and dispensing apparatus for depositing material, the apparatus comprising:
    a housing;
    a gantry system supported by the housing;
    a movement mechanism coupled to the gantry system; and
    a dispensing unit coupled to the movement mechanism and configured to deposit material; and
    wherein the dispensing unit assumes an increasing angle of tilt by manipulating the movement mechanism,
    wherein the movement mechanism includes
        a rotary drive assembly coupled to the dispensing unit at an upper end of the dispensing unit,
        a gimbal assembly coupled to the dispensing unit at a lower end of the dispensing unit, and
        a C-shaped bracket secured to the gantry system, the gimbal assembly being provided at a lower end of the C-shaped bracket and configured to support the dispensing unit.

2. The apparatus of claim 1, wherein the movement mechanism further includes a motor assembly secured to the C-shaped bracket at an upper end of the C-shaped bracket.

3. The apparatus of claim 2, wherein the movement mechanism further includes a motor shaft coupled to the motor, the motor shaft being configured to drive the rotation of a disk coupled to the upper end of the dispensing unit.

4. The apparatus of claim 3, wherein the movement mechanism further includes a downwardly extending post that is adjustable with respect to a centerline of the disk, and a swivel arm connected to the gimbal assembly and the post, and wherein as the post is moved away from the motor shaft, a direction of the dispensing head is controlled by rotating the motor to change a location of the post in an arc around the motor shaft.

5. The apparatus of claim 1, wherein the gimbal assembly includes a U-shaped bracket rotatably attached to the C-shaped bracket along a horizontal axis.

6. The apparatus of claim 5, wherein the gimbal assembly further includes a mounting bracket pivotally attached to the U-shaped bracket along an axis that is perpendicular to the horizontal axis.

7. The apparatus of claim 6, wherein the mounting bracket is secured to the swivel arm at an upper end of the mounting bracket and configured to support the dispensing unit.

8. The apparatus of claim 1, further comprising a controller to control the specific tilting angle and the direction of the dispensing head to allow more variation in motion programming and control.

* * * * *